United States Patent
Mastoris et al.

(10) Patent No.: US 6,956,379 B2
(45) Date of Patent: Oct. 18, 2005

(54) TESTING DEVICE AND METHOD FOR TESTING BACKPLANES AND CONNECTORS ON BACKPLANES

(75) Inventors: Steven F. Mastoris, El Dorado Hills, CA (US); Rex M. Schrader, Roseville, CA (US); Glen H. Garland, Pollock Pines, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 133 days.

(21) Appl. No.: 10/192,129

(22) Filed: Jul. 9, 2002

(65) Prior Publication Data

US 2004/0008034 A1 Jan. 15, 2004

(51) Int. Cl.$^7$ .......................... G01R 31/04; G06F 11/00
(52) U.S. Cl. ........................................ 324/538; 714/46
(58) Field of Search .................. 324/500, 537, 324/538, 761, 763, 543, 158.1; 361/748, 361/785, 788; 370/241; 379/1.01; 702/117, 702/108, 118, 122, 124, 126; 710/104, 106, 710/107, 300; 714/720, 724, 726, 727, 27, 714/43, 46, 56

(56) References Cited

U.S. PATENT DOCUMENTS

| | | | | |
|---|---|---|---|---|
| 3,651,315 A | * | 3/1972 | Collins | 714/736 |
| 3,795,857 A | * | 3/1974 | Brown | 324/538 |
| 4,493,210 A | * | 1/1985 | Fries et al. | 73/121 |
| 4,536,703 A | * | 8/1985 | Jablway et al. | 324/540 |
| 4,658,209 A | * | 4/1987 | Page | 714/46 |
| 5,216,361 A | * | 6/1993 | Akar et al. | 324/761 |
| 5,500,862 A | * | 3/1996 | Kawamura | 714/727 |
| 5,617,018 A | * | 4/1997 | Earle | 324/72.5 |
| 5,659,552 A | * | 8/1997 | Ke et al. | 714/727 |
| 5,790,523 A | * | 8/1998 | Ritchie et al. | 370/241 |
| 5,841,788 A | * | 11/1998 | Ke | 714/726 |
| 6,067,506 A | * | 5/2000 | Goldys et al. | 702/117 |
| 6,167,542 A | * | 12/2000 | Chakraborty et al. | 714/720 |
| 6,194,908 B1 | * | 2/2001 | Wheel et al. | 324/761 |
| 6,392,160 B1 | * | 5/2002 | Andry et al. | 174/261 |
| 6,425,027 B1 | * | 7/2002 | Mills et al. | 710/300 |
| 6,532,558 B1 | | 3/2003 | Allen et al. | |
| 6,550,029 B1 | * | 4/2003 | Bailey et al. | 714/724 |
| 2002/0142811 A1 | * | 10/2002 | Gupta et al. | 455/570 |
| 2002/0194413 A1 | * | 12/2002 | Seto et al. | 710/302 |
| 2003/0033546 A1 | * | 2/2003 | Bresniker et al. | 713/300 |

FOREIGN PATENT DOCUMENTS

| | | |
|---|---|---|
| DD | 209943 | 5/1984 |
| EP | 0769703 A2 | 4/1997 |

* cited by examiner

*Primary Examiner*—Anjan Deb
*Assistant Examiner*—Hoai-An D. Nguyen

(57) ABSTRACT

A testing device for testing a backplane preferably includes an impulse board with a connector for connection to the backplane, where the impulse board sends test signals to the backplane; a receiver board with a connector for connection to the backplane, where the receiver board receives the test signals; and a communication channel between the receiver board and the impulse board through which the receiver board signals to the impulse board results of the test signals.

35 Claims, 6 Drawing Sheets

TESTING DEVICE AND METHOD FOR TESTING BACKPLANES AND CONNECTORS ON BACKPLANES

FIELD OF THE INVENTION

The present invention relates to the field of evaluating pin connectors and backplanes. More specifically, the present invention provides a testing device and methods of testing pin connectors and backplanes, e.g., in a blade server.

BACKGROUND OF THE INVENTION

Computers and their peripheral devices are used for a wide variety of purposes including, data storage, communication, and document creation. Peripheral Component Interconnect (PCI) is a local bus that is commonly used to connect a computer with one or more peripheral devices. A PCI bus provides a high-speed connection with peripherals and can connect multiple peripheral devices to the host computer. The PCI bus typically plugs into a PCI slot on the motherboard of the host computer.

CompactPCI or "cPCI" was introduced in 1995 based on the PCI standard and has since become one of the fastest-growing industrial bus architectures to date. Initially targeted at the telecommunications and industrial control markets, CompactPCI takes the popular PCI interface and packages it into a smaller, more rugged unit. The most noticeable change made to the architecture was the adoption of a form factor in which all dimensions and mechanical components are standardized by the Institute of Electrical and Electronics Engineers (IEEE). Consequently, numerous vendors can supply mechanically interchangeable components.

One important use of the CompactPCI is in a blade server, also called an ultradense server. Blade servers are comprehensive computing systems that include processor, memory, network connections, and associated electronics, all mounted on a single motherboard called a blade. There are many types of blades—server blades, storage blades, network blades and more.

The server blade, along with storage, networking and other blades, are typically installed in a rack-mountable enclosure that houses multiple blades that share common resources such as cabling, power supplies, and cooling fans. The blades are connected into a common circuit board, called a backplane, that provides connections to and between blades for both data and power. With its modular, hot-pluggable architecture, the easily accessible blade server offers increased computing density while ensuring both maximum scalability and ease of management.

Typically, the backplane provides rows of pins, preferably configured according to the cPCI standard, for connection to the various blades that might be installed in the blade server. The blades each have a corresponding connector that includes receptacles or holes in which the pins of the connector on the backplane are received when the blade is installed. Because of the complex and tightly packed circuitry that may exist on a blade, a large number of connections are required between the blade and the backplane. Consequently, there are a relatively large number of delicate pins provided in each connection row on the backplane that might receive a blade.

The pins are packed close together, preferably according to the cPCI standard, to provide the necessary number of connections to each blade within an appropriate amount of real estate on the backplane. In part because the pins are so closely packed together, the pins are relatively thin and, therefore, somewhat delicate. A pin can easily be bent or broken.

Damage to the pins can occur when a blade is improperly installed. Damage to the pins can also occur during the manufacturing, storage or shipping of the backplane.

If a pin is broken or bent and fails to make a connection with an installed blade, the blade will likely not function properly. It may be very difficult to identify the problem as a bent or missing pin among so many pins on the backplane. Consequently, it would be very useful to be able to verify whether any pins have been bent or broken, or have shorted, prior to placing the backplane in service or installing a blade. It would also be very useful to be able to verify the proper operation of the backplane prior to assembly of the blade server.

SUMMARY OF THE INVENTION

In one of many possible embodiments, the present invention provides a testing device for testing a backplane. The testing device preferably includes an impulse board with a connector for connection to the backplane, where the impulse board sends test signals to the backplane; a receiver board with a connector for connection to the backplane, where the receiver board receives the test signals; and a communication channel between the receiver board and the impulse board through which the receiver board signals to the impulse board results of the test signals.

Additional advantages and novel features of the invention will be set forth in the description which follows or may be learned by those skilled in the art through reading these materials or practicing the invention. The advantages of the invention may be achieved through the means recited in the attached claims.

BRIEF DESCRIPTION OF THE DRAWINGS

The accompanying drawings illustrate preferred embodiments of the present invention and are a part of the specification. Together with the following description, the drawings demonstrate and explain the principles of the present invention. The illustrated embodiments are examples of the present invention and do not limit the scope of the invention.

Throughout the drawings, identical reference numbers designate similar, but not necessarily identical, elements.

DETAILED DESCRIPTION OF THE PREFERRED EMBODIMENTS

Figure 1:
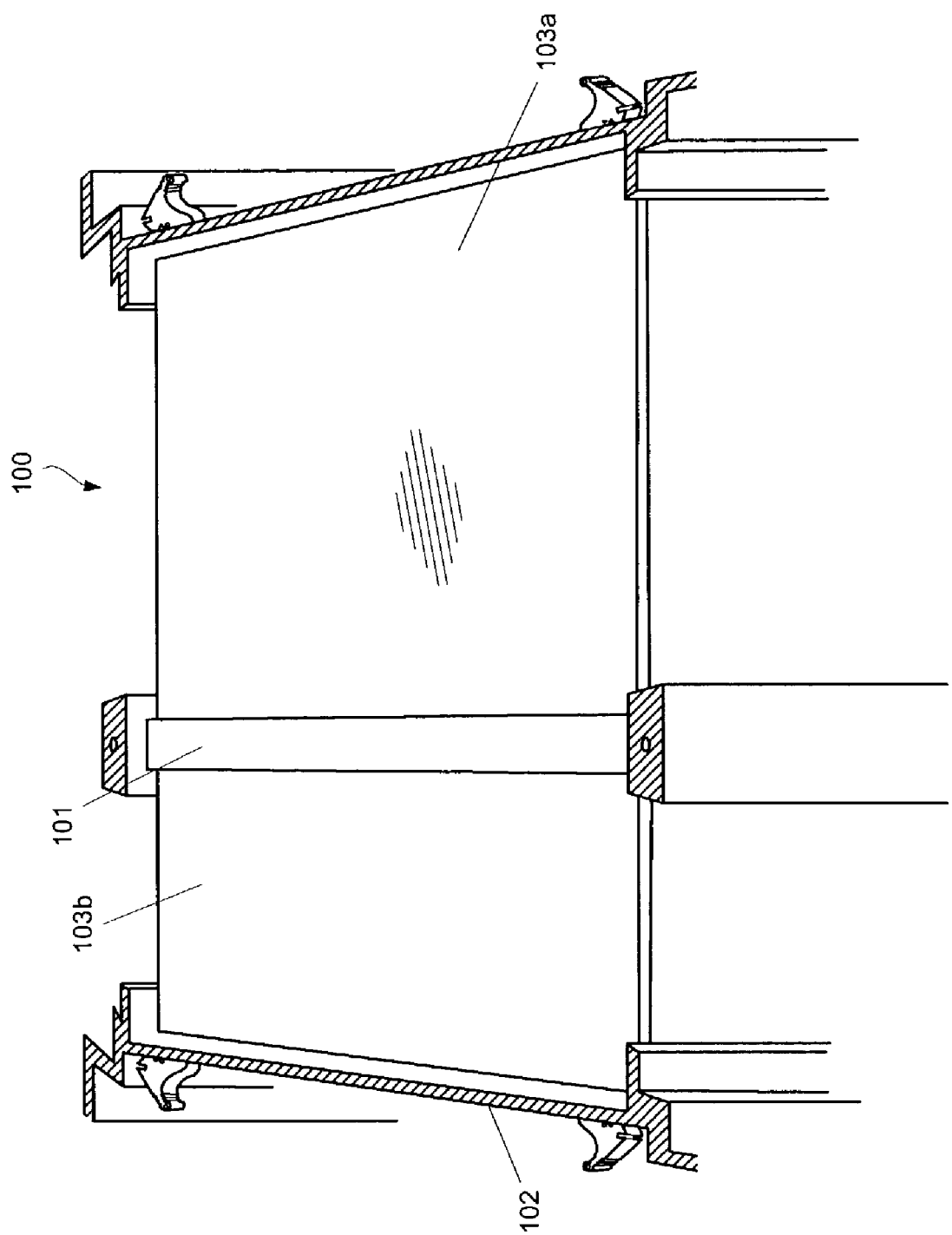
FIG. 1 is an illustration of a blade server that may be tested using methods and devices according to embodiments of the present invention.

FIG. 1 is an illustration of a blade server that may be tested using methods and devices according to embodiments of the present invention. As shown in FIG. 1, and as mentioned above, a typical blade server (100) includes a backplane (101) mounted in a rack (102). The backplane (101) preferably has pin connectors on both sides for receiving the blades of the blade server (100).

The blades connected to the backplane (101) may all be of the same size. Alternatively, as shown in FIG. 1, the blades (103a) connected to one side of the backplane (101) may be larger than the blades (103b) connected to the other side of the backplane (101). When the blade server (100) is assembled, the blades (103) are connected to the backplane (101) and supported within the server rack (102).

A number of blades (103) can be connected to each side of the backplane (101). For example, the backplane (101) may have nineteen slots for blades (103) on each side of the backplane (101).

Figure 2:
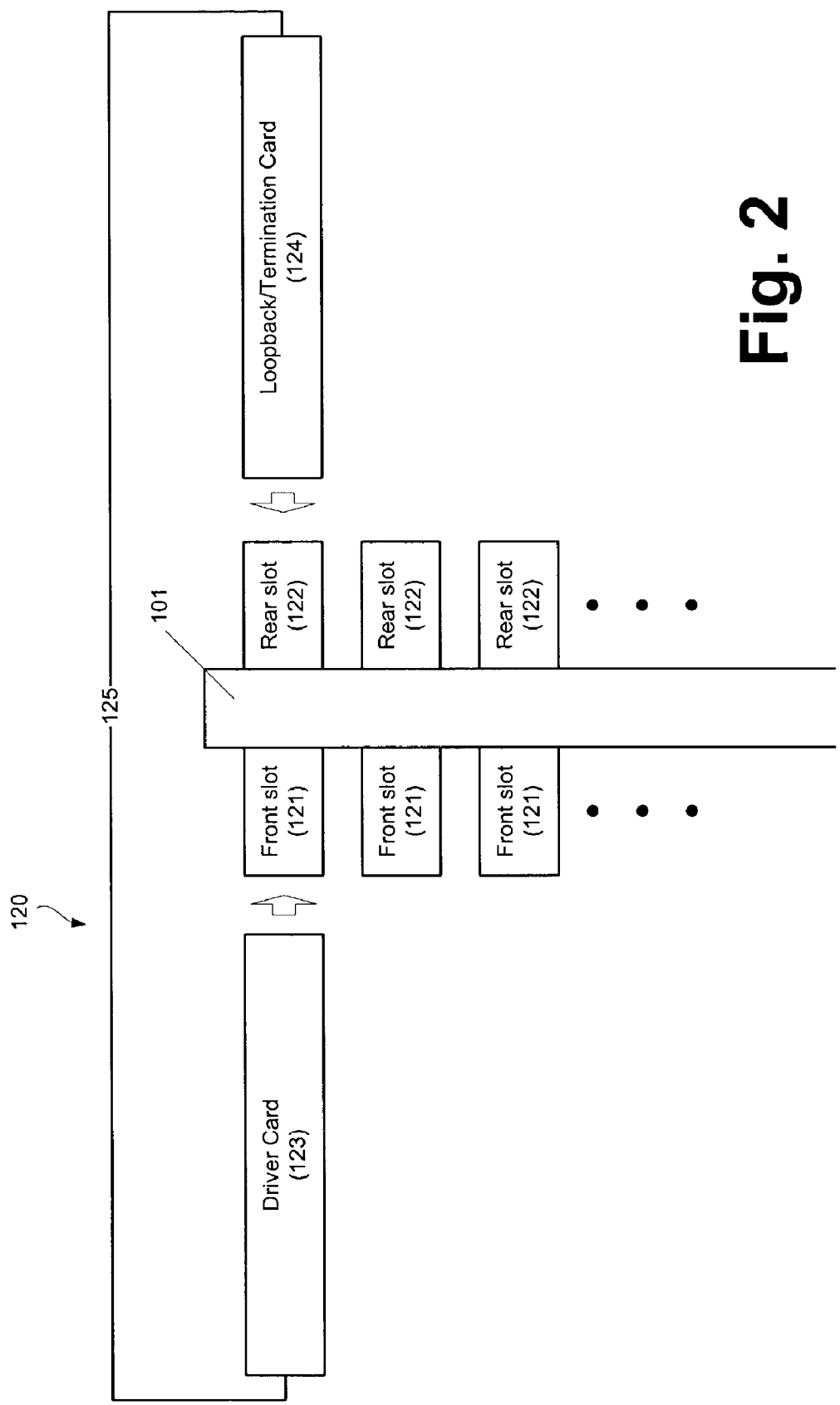
FIG. 2 is a block diagram of an embodiment of a backplane testing device according to an embodiment of the present invention.

FIG. 2 is a block diagram of an embodiment of a backplane testing device according to an embodiment of the present invention. As shown in FIG. 2, and as explained above, the backplane (101) has a set of slots or connectors (121) on a "front" side of the backplane (101), and a second set of slots or connectors (122) on a "rear" side of the backplane (101). Each slot (121, 122) provides rows of pins for connection with a blade. Preferably, the pins of the slots (121, 122) are arranged according to the cPCI standard.

Each slot (121, 122) has pins dedicated to different functions. For example, each slot (121, 122) has data pins through which data is transmitted, power pins through which the connected blade receives power, and ground pins for grounding the connected blade. Additionally, the data pins are further categorized by the types of data carried or the function performed.

According to an embodiment of the present invention, a testing device (120) for the backplane (101) includes a driver card (123) (also known as an impulse board), a loopback or termination card (124) (also known as a receiver board) and a communication channel (125) between the two cards (123, 124). The communication channel (125) can be wired (e.g., electrical cable, optical cable, etc.) or wireless (e.g., radio frequency, infrared, etc.). The communication channel (125) is external to the backplane (120) and allows the driver card (123) and loopback card (124) to communicate data and create a feedback loop.

Each card (123, 124), as will be illustrated later, includes a connector, preferably a cPCI connector, like the connector on a blade used to connect the blade to the backplane (101) of a blade server. As shown in FIG. 2, the driver card (123) is connected to a slot (e.g., 121) of the backplane (101), while the loopback card (124) is connected to another slot (e.g., 122) of the backplane (101).

With the testing device (120) connected between two slots (121, 122) of the backplane (101), the testing device (120) can send test signal between the two cards (123, 124) to verify the presence and operability of all the pins in the connectors of the backplane (101) to which the cards (123, 124) are connected. The test signals passing between the cards (123, 124) can also be used to verify the proper operation of the backplane (101) and the connections provided by the backplane (101) between blade slots (121, 122), to power and ground lines, etc.

The driver card (123) generates the appropriate test signals that are applied to the backplane (101) through the slot (121) to which the driver card (123) is connected. The test signals are received (or not received) by the loopback card (124). The loopback card (124) then signals to the driver card (123) via the communication channel (125) as to the receipt or non-receipt of the test signals. Consequently, as will be explained further below, the driver card (123) can then indicated to a technician whether the pins of the connectors are present and operable, and whether the backplane (101) is functioning properly.

Figure 3:
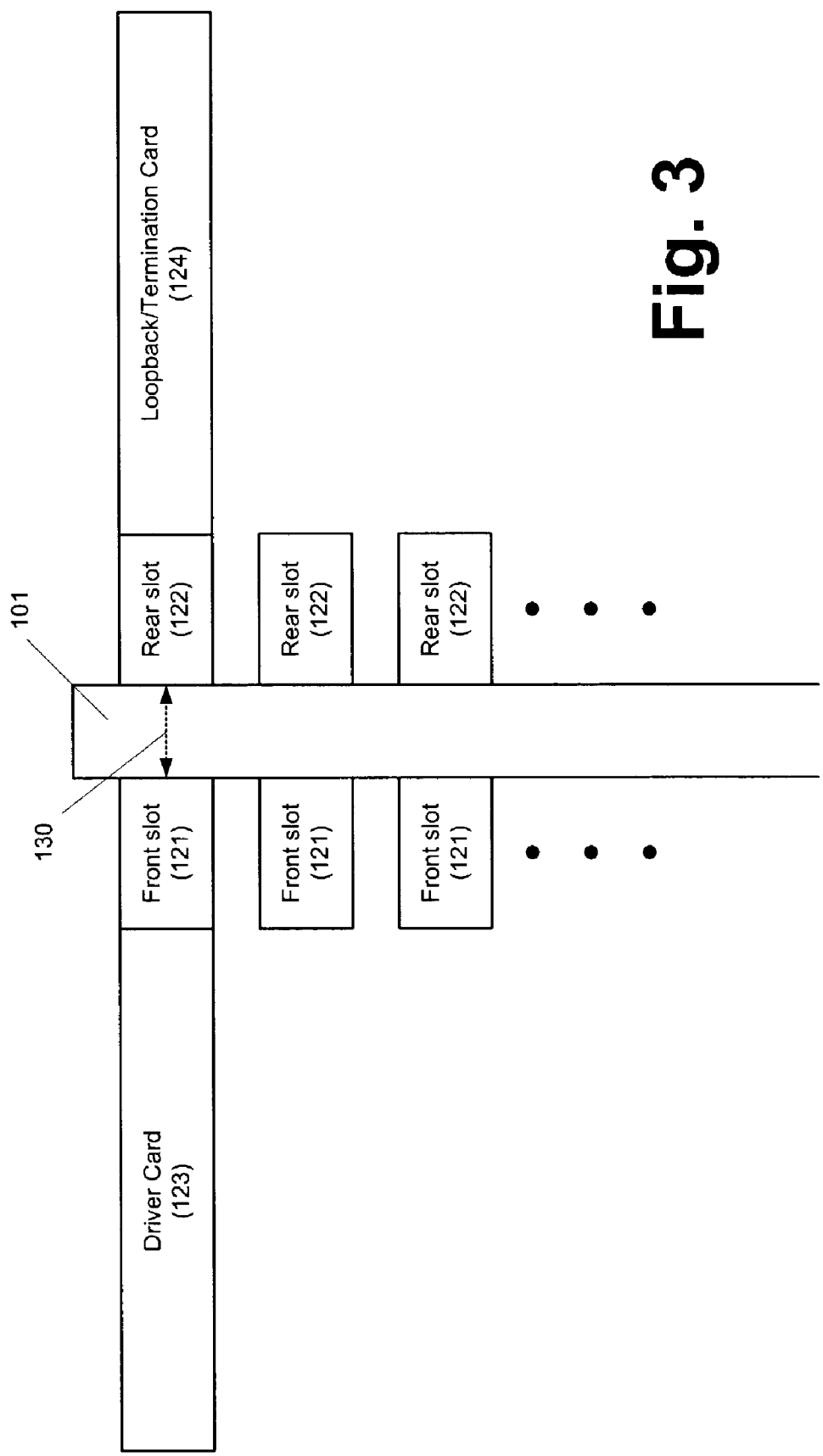
FIG. 3 is a block diagram of an embodiment of a backplane testing device according to another embodiment of the present invention.

FIG. 3 is a block diagram of an embodiment of a backplane testing device according to another embodiment of the present invention. As shown in FIG. 3, it is not necessary to have a communication channel between the driver card (123) and the loopback card (124) as shown in FIG. 2. Rather, the connections (130) within the backplane (101) between slots (121, 122) can be used by the loopback card (124) to report data to the driver card (123).

Figure 4:
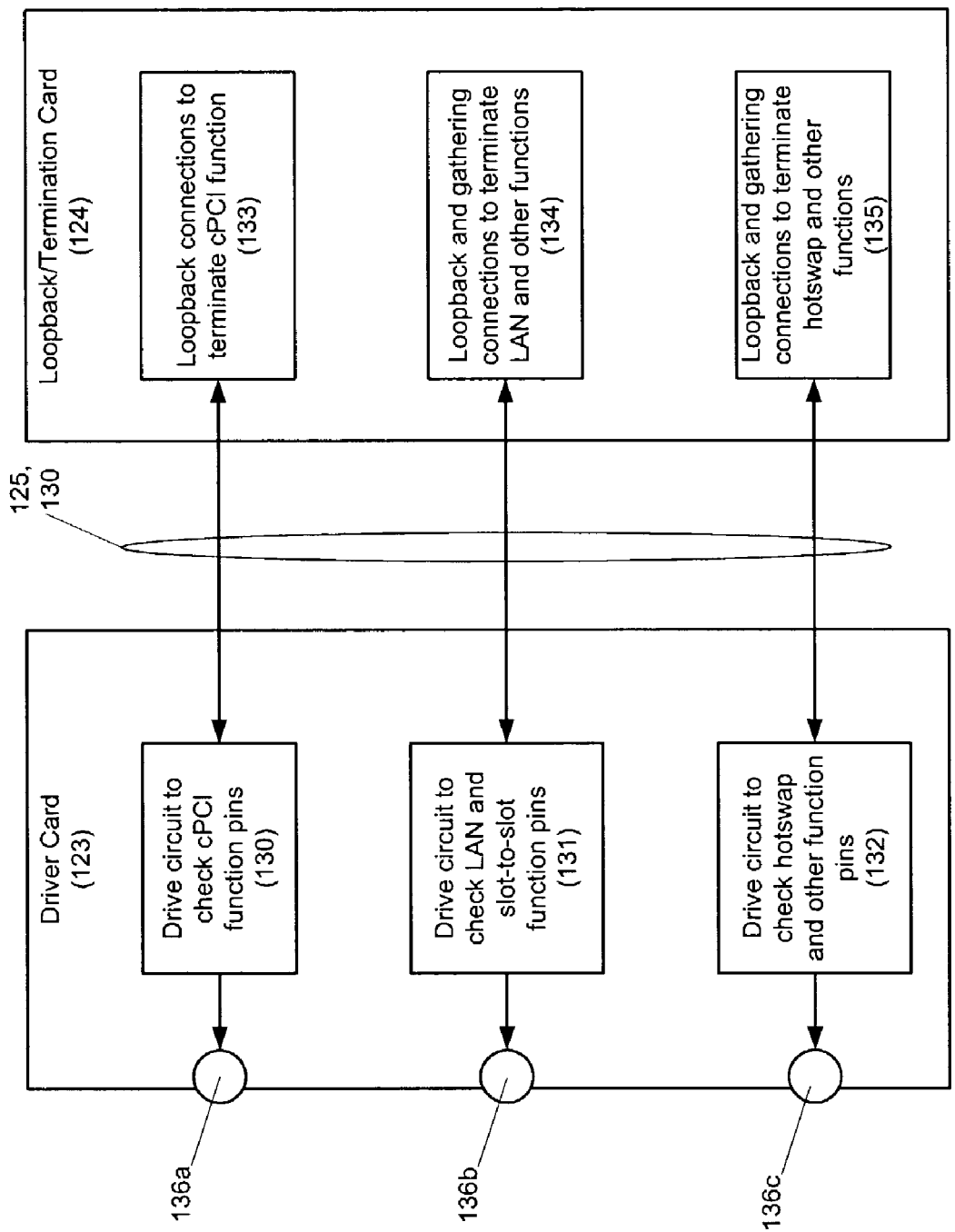
FIG. 4 is a block diagram of the internal components of a backplane testing device according to an embodiment of the present invention.

FIG. 4 is a block diagram of the internal components of a backplane testing device according to an embodiment of the present invention. As shown in FIG. 4, the circuitry in the cards (123, 124) can be logically divided into at least three separate functions.

First, the driver card (123) preferably includes circuitry that can be characterized as a drive circuit (130) for generating test signals to evaluate the cPCI function pins of the connector on the backplane to which the driver card (123) is connected. This drive circuit (130) sends test signals through the backplane via the cPCI function pins that can be received at the corresponding loopback card (124), which is also connected to the backplane. Based on the receipt or non-receipt of the test signals, loopback connections (133) in the loopback card (124) terminate the cPCI functions and report the results of the test to the corresponding drive circuit (130) of the driver card (123) via the communication channel (125, 130).

Second, the driver card (123) preferably includes circuitry that can be characterized as a drive circuit (131) for generating test signals to evaluate the Local Area Network (LAN) and slot-to-slot function pins of the connector on the backplane to which the driver card (123) is connected. This drive circuit (131) also sends test signals through the backplane via the LAN and slot-to-slot pins that can be received at the corresponding loopback card (124), which is also connected to the backplane. Based on the receipt or non-receipt of the test signals, loopback and gathering connections (134) in the loopback card (124) terminate the cPCI functions and report the results of the test to the corresponding drive circuit (131) of the driver card (123) via the communication channel (125, 130).

Third, the driver card (123) preferably includes circuitry that can be characterized as a drive circuit (132) for generating test signals to evaluate the hotswap and other function pins of the connector on the backplane to which the driver card (123) is connected. Hotswap pins allow the connectors of the backplane to receive a new blade or release a connected blade without first shutting down the blade server. This drive circuit (132) sends test signals through the backplane via the hotswap and other function pins which can be received at the corresponding loopback card (124), which is also connected to the backplane. Based on the receipt or non-receipt of the test signals, loopback and gathering connections (135) in the loopback card (124) terminate the hotswap and other functions being tested and report the results of the test to the corresponding drive circuit (132) of the driver card (123) via the communication channel (125, 130).

The driver card (123) preferably includes one or more indicators (136) that can be used to signal to a technician that the tests of the connector and/or backplane have been successful or have failed. In the embodiment of FIG. 4, the driver card (123) includes three indicators (136), which are preferably light emitting diodes (LEDs). For example, the LEDs (136) may be normally unlit and remain unlit so long as the tests of the connector and/or backplane are successful. If any test fails, a corresponding LED (136) may then be lit to indicate to the operator of the testing device that a failure has occurred.

In the embodiment of FIG. 4, a separate LED (136) is connected to each of the three drive circuits (130–132) described above. Thus, if a cPCI function test fails, a particular LED (136a) will be lit by the corresponding drive circuit (130). If a LAN or slot-to-slot function fails, a different LED (136b) will be lit by the corresponding drive circuit (131). If a hotswap or other function fails, a third LED (136c) will be lit by the corresponding drive circuit (132). In this way, the operator of the test device will have a better idea of the problem found so that further diagnosis and corrective action can be appropriately taken.

It will be appreciated by those skilled in the art that the indicators (136) may be any device or devices that can indicate to the device operator that test has succeeded or failed. For example, the indicators (136) may be combined as a liquid crystal display (LCD). The indicators (136) may include a speaker or speakers that give auditory success or failure indications.

Additionally, the set of indicators may be configured in various ways to serve different purposes. For example, if the testing device is designed especially to test for the presence and operability of the pins in a cPCI pin connection, the pins of that connection are grouped into five groups. Consequently, the bank of indicators (136) may include five separate indicators, for example, LEDs, that correspond to the five groups of pins. If an open is detected in any of the groups, indicating a missing or bent pin, the corresponding indicator (136) is activated, e.g., the corresponding LED is lit. In this way, the operator of the testing device is able to know in which group of pins of the connector to search for the missing or inoperative pin.

Figure 5:
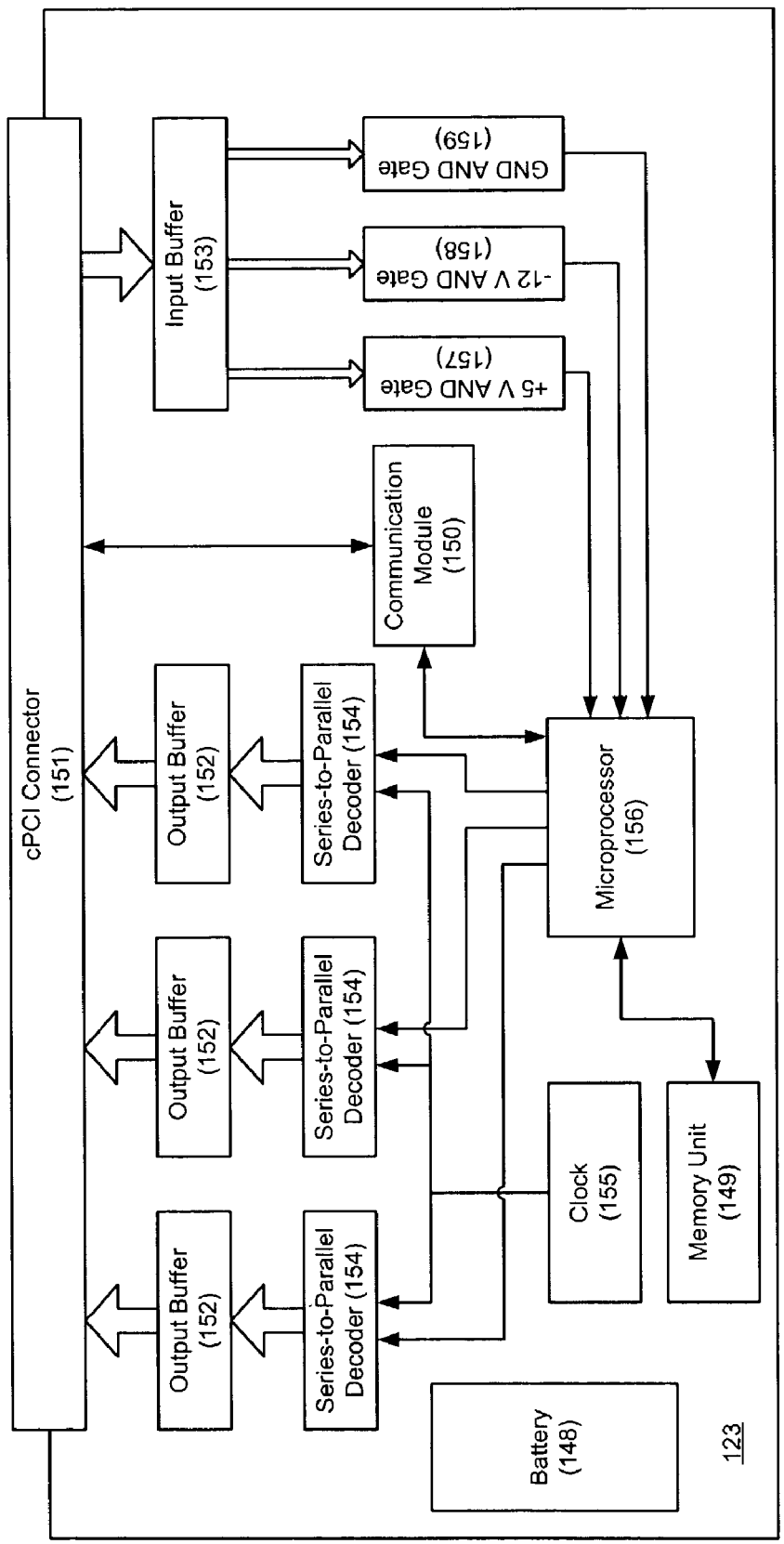
FIG. 5 is a more detailed block diagram of the internal components of an impulse board or driver card of a backplane testing device according to an embodiment of the present invention.

FIG. 5 is a more detailed block diagram of the internal components of an impulse board or driver card of a backplane testing device according to an embodiment of the present invention. As shown in FIG. 5, the impulse board or driver card (123) includes connector (151) for connection to a slot of the backplane being tested. The connector (151) is preferably a cPCI connector.

The impulse board (123) also includes a microprocessor or microcontroller (156) for controlling the operation of the impulse board (123) as test signals are generated. A memory unit (149), preferably an electrically erasable and programmable read only memory (EEPROM) unit, may also be provided. The memory unit (149) can contain a variety of test algorithms that can be executed by the microprocessor (156) for different backplanes and configurations. In this way, the testing device of the present invention can be used in a variety of environments or can be programmed according to the specific needs of a particular operator.

A battery (148) is preferably included to provide power for the testing device. In this way, the testing device can be moved about and used more flexibly without concern for maintaining an external power source. This battery (148) may be rechargeable.

To generate the desired test signals, the microprocessor (156) signals a group of series-to-parallel decoders (154). These decoders (154) take the serial signal from the microprocessor and decode it into a parallel signal that can be sent in parallel over the various pins or traces to be tested. As shown in FIG. 5, there may be three such decoders (154) which correspond to the three drive circuits performing logically different functions as described above in connection with FIG. 4.

As each serial signal is converted to a parallel signal, the decoder (154) feeds the parallel signal to an output buffer (152). The output buffer (152) buffers the signal until the process of converting from a series signal to a parallel signal is complete. The buffers (152) then provide the outgoing parallel test signals through the connector (151) and into the backplane being tested. A clock (155) provides a common clock signal to the decoders (154) to synchronize operations.

As described above, the results of the test, as detected by the receiver board (124), are signaled back to the impulse board (123) in a feedback loop. Thus, an input buffer (153) is connected to the connector (151) for receiving signals to the impulse board (123) that are sent through the backplane being tested. These signals are monitored by a set of AND gates (157–159) which, in turn, signal the microprocessor (156) of the test results.

If any of the inputs to one of the AND gates is low, this indicates a failure of some component being tested. The AND gates (157–159) then send signals to the microprocessor based on whether all inputs to a particular gate are high. The AND gates preferably include a+5 Volt AND gate (157), a–12 Volt AND gate (158) and a ground (GND) AND gate (159). The microprocessor (156) is programmed to correctly interpret these results and operate a bank of indicators (not shown) accordingly to indicate the results of the test to the testing device operator.

Among the test signals, and during operation of the backplane, there are a large number of +5 V, –12 V, and GND signals going to and from connected components. If the pin or trace for carrying any one of these signals is non-functional, it may cause a problem. Thus, the impulse board (123) will send a signal on each of these "rails," one at a time. The signal is looped back by the receiver board (124) to the AND gates (157–159) on the impulse board (123). The gates (157–159) must receive a looped back signal on ALL of the AND Gate inputs to indicate that the voltage rails/grounds are functioning.

A reason for employing AND gates is to reduce the number of signals input to the microprocessor (156). The microprocessor (156) is not signaled as to which pin or trace may be faulty, but is merely signaled that all pins and traces are testing as operational, i.e., all the inputs to the AND gates (157–159) are high, or not all pins and traces are testing operational, i.e., not all the AND gate inputs are high.

An embodiment of the present invention could be created in which the testing device determines and reports exactly which pin or trace is faulty. However, the reason for simplifying is that there are probably 30+ inputs for each voltage/ground. Inputs on microcontrollers are expensive. Thus, it is more economical to provide three inputs to the microprocessor (156) from the AND gates (157–159) rather than 90 individual inputs.

Additionally, as described above, there may be an external communications channel between the impulse board (123) and the receiver board (124), i.e., a communications channel that does not run through the backplane. Consequently, the impulse board (123) may include a communication module (150) for communicating directly with the receiver board to receive signals indicative of the test results. This communication module (150) may be wired or wireless, as described above.

In one embodiment, there may be radio frequency (RF) communication between the impulse board (123) and the receiver board (124). This RF communication can be carried over the ground (GND) pins in the backplane chassis so that no external wire is required. For this purpose, the communication module (150) would be an RF transceiver and would be connected through the connector (151) to the ground pins of the backplane, as illustrated in FIG. 5. However, in other embodiments, the communication module (150) would not require a connection to the connector (151), but would communicate directly, wirelessly or by wire, with a corresponding communication module on the receiver board, described below.

Figure 6:
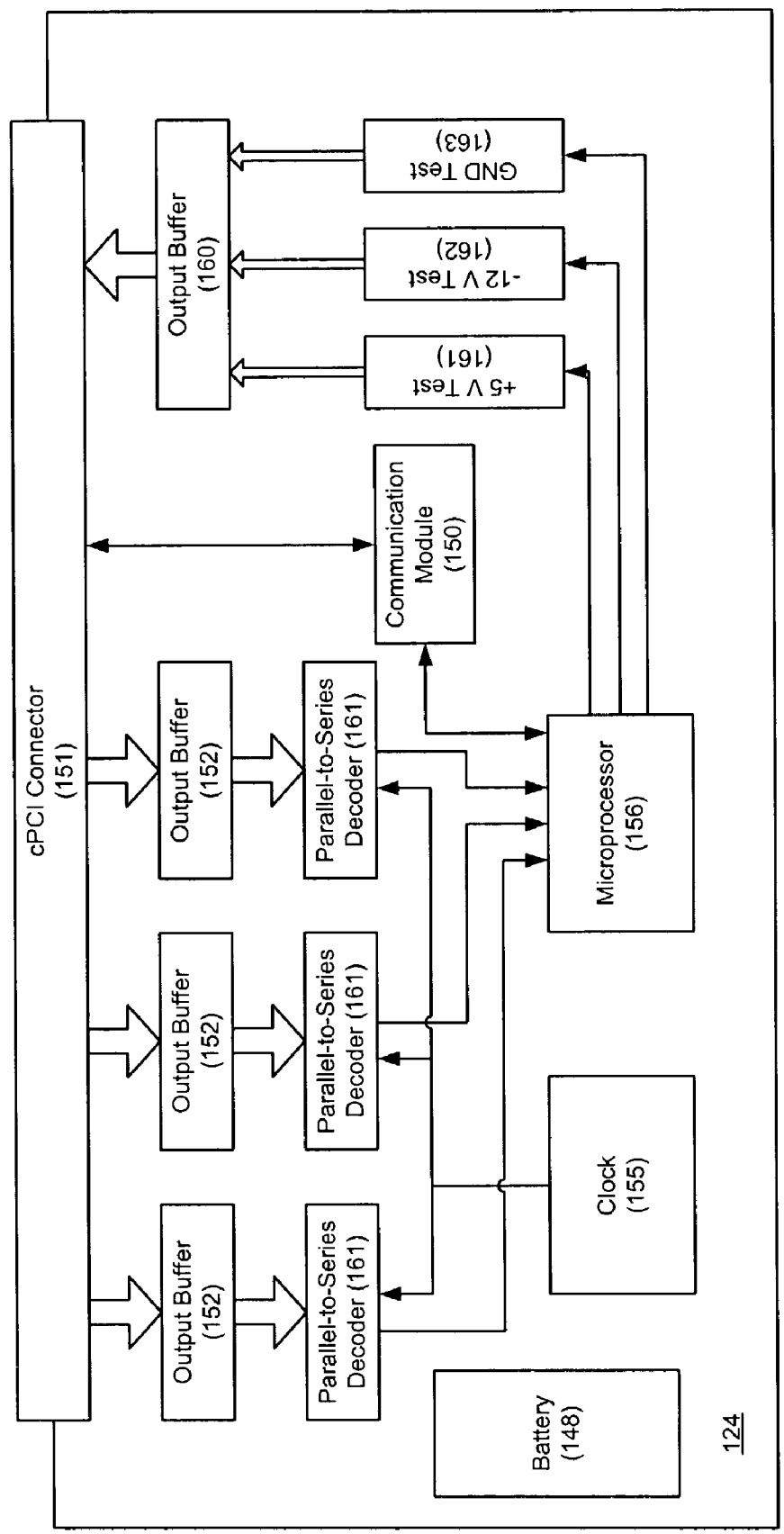
FIG. 6 is a more detailed block diagram of the internal components of a receiver board or loopback/termination card of a backplane testing device according to an embodiment of the present invention.

FIG. 6 is a more detailed block diagram of the internal components of a receiver board or loopback/termination card of a backplane testing device according to an embodiment of the present invention. As shown in FIG. 6, the loopback card or receiver board (124) is very similar in structure to the impulse board (123) described above. The receiver board (124) also preferably includes a battery (148) to provide power. This prevents the need to supply power to the receiver board (124) from an external source or from the battery on the impulse board.

The receiver board (124) also includes a connector (151), preferably a cPCI connector, for connection to a backplane. Parallel signals from the pins of the backplane connector are received through the connector (151) by output buffers (152). These buffers (152) feed the incoming signals to one or more parallel-to-series decoders that convert the incoming signals to serial signals that are, in turn, input to the microprocessor (156). A clock (155) synchronizes the operation of the decoders (154). This processor (156) may also have a memory device (not shown) like the memory device (149; FIG. 5) on the impulse board (123) to provide appropriate programming and test patterns for the processor (156).

Based on the incoming test signals, the microprocessor (156) loops signals back to the impulse board that indicate the success or failure of the test. As described above, a communication module (150), wired or wireless, may be included to supply direct communication between the receiver board (124) and the impulse board (123). A connection between the communication module (150) and the connector (151) may be provided to, as described above, allow for RF communication over the ground pins of the backplane.

The microprocessor (156) may feed incoming test signals to test circuitry (161–162). Preferably, there is a+5 Volt test circuit (151), a–12 Volt test circuit (162) and a ground (GND) test circuit (163). These test circuits correspond to the AND gates (157–159; FIG. 5) on the impulse board (123) and provide the loopback of the test signals to the impulse board as described above.

The test circuits (161–163) output parallel signals to an output buffer (160). The output buffer (160) sends the signals through the connector (151) and the backplane being tested to the receiver board (123). As described above, the receiver board (123) receives these signals through an input buffer (153) and, through the use of AND gates, evaluates the receipt or non-receipt of the test signals to determine the success or failure of the components being tested.

The preceding description has been presented only to illustrate and describe the invention. It is not intended to be exhaustive or to limit the invention to any precise form disclosed. Many modifications and variations are possible in light of the above teaching. For example, the receiver board, instead of the impulse board could include the indicators and could signal the results of the test without looping signals back to the impulse board. The impulse board would signal the receiver board that a test has been initiated and the nature of the test. With appropriate programming, the receiver board can then read the results of the test and indicate success or failure without feeding signals back to the impulse board.

The preferred embodiments were chosen and described in order to best illustrate the principles of the invention and its practical applications. The preceding description is intended to enable others skilled in the art to best utilize the invention in various embodiments and with various modifications as are suited to the particular use contemplated. It is intended that the scope of the invention be defined by the following claims.

What is claimed is:

1. A testing device for testing a backplane, said testing device comprising:
   an impulse board comprising a connector for connection to said backplane, said impulse board sending test signals to said backplane;
   a receiver board comprising a connector for connection to said backplane, said receiver board receiving said test signals;
   a communication channel between said receiver board and said impulse board through which said receiver board signals to said impulse board results of said test signals;
   wherein said communication channel comprises a wireless communication link between said impulse board and said receiver board; and
   wherein said wireless communication link comprises radio frequency transmission using pins of said backplane.

2. The testing device of claim 1, wherein said impulse board comprises at least one series-to-parallel decoder for converting a serial test signal into a parallel test signal.

3. The testing device of claim 2, wherein said decoder is connected to an output buffer for buffering said parallel test signal until conversion of said serial test signal is complete.

4. The testing device of claim 1, wherein said communication channel comprises said backplane.

5. The testing device of claim 1, wherein said communication channel comprises a signal cable, external to said backplane, connected between said impulse board and said receiver board.

6. The testing device of claim 1, further comprising at least one battery for powering said testing device.

7. The testing device of claim 1, wherein said connectors are Compact Peripheral Component Interconnect (cPCI) connectors.

8. The testing device of claim 1, further comprising an indicator for indicating results of a test conducted with said test signals.

9. The testing device of claim 8, wherein said indicator comprises a plurality of light-emitting diodes.

10. The testing device of claim 1, wherein said impulse board further comprises a plurality of AND gates receiving test signals returned by said receiver board, said AND gates outputting an operational signal if all expected test signals are received.

11. The testing device of claim 1, wherein said impulse board further comprises a drive circuit configured to generate test signals for testing Compact Peripheral Component Interconnect (cPCI) function pins of said backplane.

12. The testing device of claim 1, wherein said impulse board further comprises a drive circuit configured to generate test signals for testing hotswap function pins of said backplane.

13. The testing device of claim 1, wherein said receiver board comprises at least one parallel-to-series decoder for converting a parallel test signal into a serial test signal for analysis by said receiver board.

14. The testing device of claim 13, wherein said receiver board further comprises at least one buffer for buffering said parallel test signal.

15. A method of testing a backplane, said method comprising:
  connecting an impulse board to said backplane;
  connecting a receiver board to said backplane;
  sending test signals from said impulse board to said backplane;
  receiving said test signals with said receiver board;
  communicating results of said test signals through a communication channel between said receiver board and said impulse board through which said receiver board signals to said impulse board;
  wherein said communicating results comprises wirelessly communicating said results through a wireless communication link between said impulse board and said receiver board; and
  wherein said wirelessly communicating comprises making radio frequency transmission using pins of said backplane.

16. The method of claim 15, further comprising powering said testing device with at least one battery.

17. The method of claim 15, wherein said connectors are Compact Peripheral Component Interconnect (cPCI) connectors.

18. The method of claim 15, further comprising indicating results of a test conducted with said test signals.

19. The method of claim 18, wherein said indicating is performed with an indicator comprising a plurality of light-emitting diodes.

20. The method of claim 15, further comprising evaluating said results of said test signals with a plurality of AND gates on said impulse board that receive test signals returned by said receiver board, said AND gates outputting an operational signal if all expected test signals are received.

21. The method of claim 15, wherein said communicating results comprises communicating through said backplane.

22. The method of claim 15, further comprising forming said communication channel by connecting a signal cable, external to said backplane, between said impulse board and said receiver board.

23. A device for testing a backplane, said device comprising:
  means for connecting an impulse board to said backplane;
  means for connecting a receiver board to said backplane;
  means for sending test signals from said impulse board to said backplane;
  means for receiving said test signals with said receiver board;
  means for communicating results of said test signals between said receiver board and said impulse board through which said receiver board signals to said impulse board;
  wherein said means for communicating comprise a wireless communication link between said impulse board and said receiver board; and
  wherein said wirelessly communication link comprises radio frequency transmission using pins of said backplane.

24. The device of claim 23, wherein said means for communicating comprise said backplane.

25. The device of claim 23, wherein said means for communicating comprise a signal cable, external to said backplane, between said impulse board and said receiver board.

26. The device of claim 23, further comprising means for powering said testing device.

27. The device of claim 26, wherein said means for powering said testing device comprise at least one battery.

28. The device of claim 23 wherein said means for connecting are Compact Peripheral Component Interconnect (cPCI) connectors.

29. The device of claim 23, further comprising means for indicating results of a test conducted with said test signals.

30. The device of claim 29, wherein said means for indicating test results comprise a plurality of light-emitting diodes.

31. The device of claim 23, further comprising means for evaluating said results of said test signals on said impulse board.

32. The device of claim 31, wherein said means for evaluating comprise a plurality of AND gates on said impulse board that receive test signals returned by said receiver board, said AND gates outputting an operational signal if all expected test signals are received.

33. A testing device for testing a backplane, said testing device comprising:
  an impulse board comprising a connector for connection to said backplane, said impulse board sending test signals to said backplane;
  a receiver board comprising a connector for connection to said backplane, said receiver board receiving said test signals; and
  a communication channel between said receiver board and said impulse board through which said receiver board signals to said impulse board results of said test signals;
  wherein said impulse board further comprises a plurality of AND gates receiving test signals returned by said receiver board, said AND gates outputting an operational signal if all expected test signals are received; and
  wherein said plurality of AND gates comprise three AND gates, a first AND gate for +5 volt signals, a second AND gate for −12 volt signals and a third AND gate for ground test signals.

34. A testing device for testing a backplane, said testing device comprising:
  an impulse board comprising a connector for connection to said backplane, said impulse board sending test signals to said backplane;
  a receiver board comprising a connector for connection to said backplane, said receiver board receiving said test signals; and a communication channel between said receiver board and said impulse board through which said receiver board signals to said impulse board results of said test signals;

wherein said impulse board further comprises a drive circuit configured to generate test signals for testing Local Area Network (LAN) and slot-to-slot function pins of said backplane.

35. A testing device for testing a backplane, said testing device comprising:

an impulse board comprising a connector for connection to said backplane, said impulse board configured to send test signals to said backplane;

a receiver board comprising a connector for connection to said backplane, said receiver board configured to receive said test signals;

a communication channel between said receiver board and said impulse board comprising a wireless communication link between said impulse board and said receiver board;

wherein said wireless communication link comprises radio frequency transmission using pins of said backplane; and wherein said receiver board is configured to signal results of said test signals to said impulse board through said communication channel.

* * * * *